United States Patent
Lin et al.

(10) Patent No.: US 10,620,750 B2
(45) Date of Patent: Apr. 14, 2020

(54) OLED TOUCH DISPLAY PANEL HAVING CATHODE OF OLED CIRCUIT ALSO SERVING AS TOUCH ELECTRODES AND DRIVING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventors: Dan Lin, Hubei (CN); Minlun Liu, Hubei (CN); Qibing Dai, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 117 days.

(21) Appl. No.: 15/736,305

(22) PCT Filed: Nov. 24, 2017

(86) PCT No.: PCT/CN2017/112901
§ 371 (c)(1),
(2) Date: Dec. 14, 2017

(87) PCT Pub. No.: WO2019/090856
PCT Pub. Date: May 16, 2019

(65) Prior Publication Data
US 2019/0138149 A1     May 9, 2019

(51) Int. Cl.
*G09G 3/30* (2006.01)
*G06F 3/041* (2006.01)
(Continued)

(52) U.S. Cl.
CPC .......... *G06F 3/0418* (2013.01); *G06F 3/044* (2013.01); *G06F 3/0412* (2013.01); *G06F 3/0443* (2019.05); *G06F 3/04164* (2019.05); *G06F 3/04184* (2019.05); *G09G 3/3233* (2013.01); *G09G 3/3258* (2013.01); *H01L 27/323* (2013.01); *G09G 2300/0426* (2013.01); *G09G 2300/0842* (2013.01); *G09G 2310/0251* (2013.01); *G09G 2354/00* (2013.01)

(58) Field of Classification Search
CPC .................. G09G 3/30–3291; G09G 3/12
See application file for complete search history.

(56) References Cited

U.S. PATENT DOCUMENTS

2013/0221856 A1* 8/2013 Soto .............. G06F 3/0412
                                                        315/152
2014/0313438 A1* 10/2014 Jun ................ G06F 3/044
                                                        349/12

(Continued)

*Primary Examiner* — Sanghyuk Park
(74) *Attorney, Agent, or Firm* — Soroker Agmon Nordman

(57) ABSTRACT

An OLED touch display panel and a driving method are provided. The OLED touch display panel includes a cathode layer. The cathode layer is divided into the two sub-cathodes separated from each other and also serving as touch electrodes. In a pixel circuit of the OLED touch display panel, under common operations of a first input terminal and a second input terminal fed with different voltages, the OLED touch display panel normally emits light or does not emit light.

10 Claims, 5 Drawing Sheets

(51) Int. Cl.
*G09G 3/3258* (2016.01)
*G06F 3/044* (2006.01)
*G09G 3/3233* (2016.01)
*H01L 27/32* (2006.01)

(56) References Cited

U.S. PATENT DOCUMENTS

2017/0262095 A1* 9/2017 Reynolds ................ G06F 3/044
2018/0120995 A1* 5/2018 Lee ....................... G06F 3/0412

* cited by examiner

OLED TOUCH DISPLAY PANEL HAVING CATHODE OF OLED CIRCUIT ALSO SERVING AS TOUCH ELECTRODES AND DRIVING METHOD THEREOF

FIELD OF INVENTION

The present disclosure relates to a technical field of flat panel display manufacturing, and more particularly to an organic light-emitting diode (OLED) touch display panel and a driving method thereof.

BACKGROUND OF INVENTION

In flat panel display technology, organic light-emitting diode (OLED) displays have the advantages of being lightweight and slim, and having active light emission, fast response speed, large viewing angles, wide color gamuts, high brightness, low power consumption, etc., and have gradually become third generation display technology after liquid crystal displays. Compared to liquid crystal displays (LCDs), OLEDs have the advantages of being more power saving and slimmer, and having wide viewing angles, which are unmatched by LCDs. Currently, people increasingly demand displaying fineness, i.e., resolution, but there exists many challenges in producing high quality and high resolution OLED displays.

With the development of portable electronic display devices, touch technology provides a new human/machine interactive interface, which is more direct and user-friendly for use. When touch technology is integrated with flat panel display technology, touch display apparatuses are formed, resulting in flat panel display apparatuses having touch functions, allowing inputs to be executed by fingers, styli, etc., and operations to be more intuitive and easy. Touch technology applied to touch display apparatuses are generally divided into two types: a capacitive type and a resistive type. Recently, the market share of capacitive touch display apparatuses has gradually grown, and has exceeded that of resistive touch display apparatuses. Therefore, the capacitive touch display apparatuses have become main stream technology in the market. Capacitive touch, by changing capacitance of panels, causes current variations which are converted into electric potential variations, so that users' touch coordinates may be determined. Capacitive touch display apparatuses may be further divided into single-layer capacitive touch display apparatuses and double-layer capacitive touch display apparatuses. Touch sensors of a double-layer capacitive touch display apparatus are respectively disposed in two sensing electrode layers (i.e., a driving electrode and a sensing electrode) separated by insulative material. By configuring conductive patterns in the two sensing electrode layers in a staggered manner, touched positions of users' fingers are sensed and determined.

Currently, touch technology that is more commonly used includes external mounting touch technology and embedded touch technology. Embedded touch technology integrates touch sensors into the insides of display panels. Because embedded touch technology allows display apparatuses to be more lightweight and slimmer compared to external mounting touch technology, embedded touch technology applied to OLED display apparatuses draws more attention. Existing embedded touch technology needs thin film layers and process flows in addition to the basis of original display panel technology. Therefore, both structures and manufacturing processes are more complicated. Increased manufacturing process difficulty causes adverse effects, such as decreased yield rates, increasing manufacturing cost.

In addition, in an existing embedded OLED touch screen, all cathodes of sub-pixels share an entire cathode layer, causing an entire module to be more lightweight and slimmer. Hence, a distance between the cathode layer and an upper touch electrode layer is very short, resulting in noise interference coming from OLEDs being huge, and parasitic capacitance between touch electrodes and cathodes being large, causing variation amounts of self-mutual capacitance to be too small after the existing OLED touch display panel is touched, and touched positions to be unable to be accurately identified.

SUMMARY OF INVENTION

The present disclosure provides an organic light-emitting diode (OLED) touch display panel and a driving method thereof, so as to solve the problem that in an existing OLED display device, because a cathode layer and a touch electrode layer are very close, and parasitic capacitance between touch electrodes and cathodes is large, variation amounts of self-mutual capacitance are too small after the existing OLED display device is touched, and touched positions are unable to be accurately identified.

In order to realize the aforementioned object, the present disclosure provides the following technical solutions.

The present disclosure provides a driving method for an OLED touch display panel. The driving method includes:

during a display period, forward conducting an OLED circuit in the pixel circuit to cause the OLED touch display panel to normally emit light using a common operation of a first input terminal fed with a low-level voltage and a second input terminal fed with a high-level voltage in a pixel circuit of the OLED touch display panel; and during a touch control period, configuring a voltage difference across the OLED circuit to be zero to cause the OLED touch display panel not to emit light using a common operation of the first input terminal fed with a high-level voltage, the second input terminal fed with a first voltage, and a capacitor maintaining the first voltage in the pixel circuit of the OLED touch display panel, wherein the second input terminal is connected with the capacitor.

In accordance with an embodiment of the present disclosure, the OLED touch display panel includes:

an array circuit layer;
a functional layer;
an anode layer;
a cathode layer formed over the functional layer and comprising at least two sub-cathodes separated from each other, wherein the sub-cathodes serve as touch electrodes; and
touch signal lines;
wherein the sub-cathodes are in one-to-one correspondence with the touch signal lines, and each of the sub-cathodes is electrically connected to a touch display chip through the touch signal line.

In accordance with an embodiment of the present disclosure, the array circuit layer is configured to, in the display period of a period of a frame of picture of the OLED touch display panel, drive the OLED touch display panel to display an image, and configured to, in the touch control period of the period of the frame of picture of the OLED touch display panel, drive the OLED touch display panel to generate a touch signal corresponding to a touch operation of a user.

In accordance with an embodiment of the present disclosure, the first input terminal is a gate electrode of a first thin film transistor and the second input terminal is a gate electrode of a second thin film transistor.

The present disclosure also provides an OLED touch display panel including:

a base substrate having an array circuit layer formed therewith;

an anode layer formed over the base substrate and comprising at east two anodes arranged in an array;

a functional layer;

a cathode layer formed over the functional layer, and comprising at least two sub-cathodes separated from each other, wherein the sub-cathodes also serve as touch electrodes; and touch signal lines;

wherein the sub-cathodes are in one-to-one correspondence with the touch signal lines, and each of the sub-cathodes is electrically connected to a touch display chip through the touch signal line;

wherein during a display period, an OLED circuit in the pixel circuit forward conducts, and the OLED touch display panel normally emits light, under a common operation of a first input terminal fed with a low-level voltage and a second input terminal fed with a high-level voltage in a pixel circuit of the OLED touch display panel; and wherein during a touch control period, a voltage difference across the OLED circuit is zero, and the OLED touch display panel does not emit light, under a common operation of the first input terminal fed with a high-level voltage, the second input terminal is fed with a first voltage, and a capacitor maintains the first voltage in the pixel circuit of the OLED touch display panel, wherein the second input terminal is connected with the capacitor.

In accordance with an embodiment of the present disclosure, the array circuit layer is configured to, in the display period of a period of a frame of picture of the OLED touch display panel, drive the OLED touch display panel to display an image, and configured to, in the touch control period of the period of the frame of picture of the OLED touch display panel, drive the OLED touch display panel to generate a touch signal corresponding to a touch operation of a user.

In accordance with an embodiment of the present disclosure, the functional layer includes:

a first common layer formed over the base substrate, and completely covering the anode layer;

a light-emitting layer formed over the first common layer, and comprising at least two light-emitting units; and a second common layer formed over the first common layer, and completely covering the light-emitting layer and the first common layer.

In accordance with an embodiment of the present disclosure, the first input terminal is a gate electrode of a first thin film transistor and the second input terminal is a gate electrode of a second thin film transistor.

The present disclosure also provides a driving method for an OLED touch display panel. The method includes:

during a display period, forward conducting an OLED circuit in the pixel circuit to cause the OLED touch display panel to normally emit light using a common operation of a first input terminal fed with a low-level voltage, a second input terminal fed with a high-level voltage, and an enable signal terminal fed with a high-level voltage in a pixel circuit of the OLED touch display panel; and during a touch control period, configuring the OLED circuit in the pixel circuit to be reverse-biased and the OLED touch display panel not to emit light in response to a high-level voltage applied to the first input terminal and a low-level voltage applied to the enable signal terminal in the pixel circuit of the OLED touch display panel.

In accordance with an embodiment of the present disclosure, the OLED touch display panel includes:

an array circuit layer;

a functional layer;

an anode layer;

a cathode layer formed over the functional layer and comprising at least two sub-cathodes separated from each other, wherein the sub-cathodes serve as touch electrodes; and touch signal lines;

wherein the sub-cathodes are in one-to-one correspondence with the touch signal lines, and each of the sub-cathodes is electrically connected to a touch display chip through the touch signal line.

In accordance with an embodiment of the present disclosure, the array circuit layer is configured to, in the display period of a period of a frame of picture of the OLED touch display panel, drive the OLED touch display panel to display an image, and configured to, in the touch control period of the period of the frame of picture of the OLED touch display panel, drive the OLED touch display panel to generate a touch signal corresponding to a touch operation of a user.

In accordance with an embodiment of the present disclosure, the first input terminal is a gate electrode of a first thin film transistor and the second input terminal is a gate electrode of a second thin film transistor.

Beneficial effects of the present disclosure are: compared to existing technology, the present disclosure, by dividing the cathode layer into the two sub-cathodes separated from each other and also serving as touch electrodes, by connecting the touch electrodes to the touch chip through the touch signal lines, and by time-division driving the OLED touch display panel using the array circuit layer, accurate positioning of touched positions may be realized, and meanwhile, thickness of a module may be decreased.

DESCRIPTION OF DRAWINGS

In order to describe a technical solution in embodiments or existing technology more clearly, drawings required to be used by the embodiments or the existing technology are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1A:
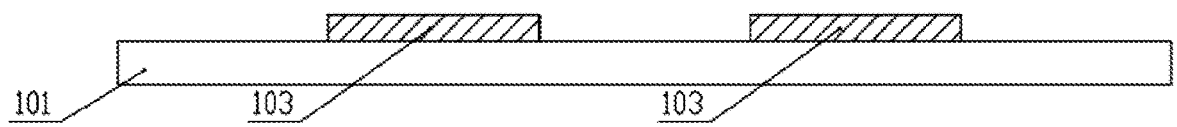
FIGS. 1A-1E are a process flowchart of a manufacturing method, for an organic light-emitting diode (OLED) touch display panel in e accordance with a preferred embodiment of the present disclosure.

The description of each embodiment below refers to respective accompanying drawing(s), so as to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

In an existing organic light-emitting diode (OLED) touch display panel and a driving method thereof, because a cathode layer and a touch electrode layer are very close, and parasitic capacitance between touch electrodes and cathodes is large, variation amounts of self-mutual capacitance are too small after the existing OLED touch display panel is touched, and touched positions are unable to be accurately identified. With respect to the aforementioned problem of the existing OLED touch display panel and the driving method thereof, the present disclosure provides an OLED touch display panel and a display apparatus, so that the present embodiments may solve the problem.

First Embodiment

First, a glass substrate is provided, and an array circuit layer is deposited over the glass substrate, to form a base substrate 101. The array circuit layer includes a buffer layer, an active layer, a gate-insulating layer, a gate electrode layer, an inter-insulating layer, a source drain electrode layer, and a passivation layer.

In the present embodiment, preferably, the active layer is a metal oxide thin film, such as indium gallium zinc oxide, and the oxide is a semiconductor. Material of the gate-insulating layer is usually silicon nitride, or may also be material such as silicon oxide or silicon oxynitride. The gate electrode layer and the source drain electrode layer may be made of metal such as molybdenum, aluminum, aluminum-nickel alloy, molybdenum-tungsten alloy, chromium, or copper, or a combined structure of thin films of the aforementioned materials. The passivation layer 214 is usually a silicon nitride compound.

As illustrated in FIG. 1A, an anode layer is deposited over the array circuit layer. Specifically, the anode layer is a transparent metal electrode, such as, preferably, indium tin oxide. The anode layer is mainly used to provide holes absorbing electrons, and because of being transparent, allows emitted light to pass therethrough.

First, a photoresist is coated over a surface of the anode layer. The photoresist is exposed and developed. The photoresist is patterned using an etching process, to divide the anode layer into at least two anodes arranged in an array.

Figure 1B:
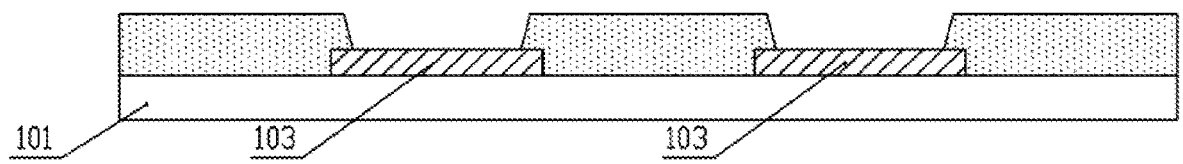

As illustrated in FIG. 1B, the pixel definition layer is deposited over the thin film transistor layer. With respect to the pixel definition layer corresponding to each of the anodes, a sub-pixel opening is formed using an etching process. The sub-pixel openings are in one-to-one correspondence with the anodes. Each of the sub-pixels is any one of a red sub-pixel, a green sub-pixel, and a blue sub-pixel. Sub-pixel colors corresponding to three neighboring sub-pixels are different.

Figure 1C:
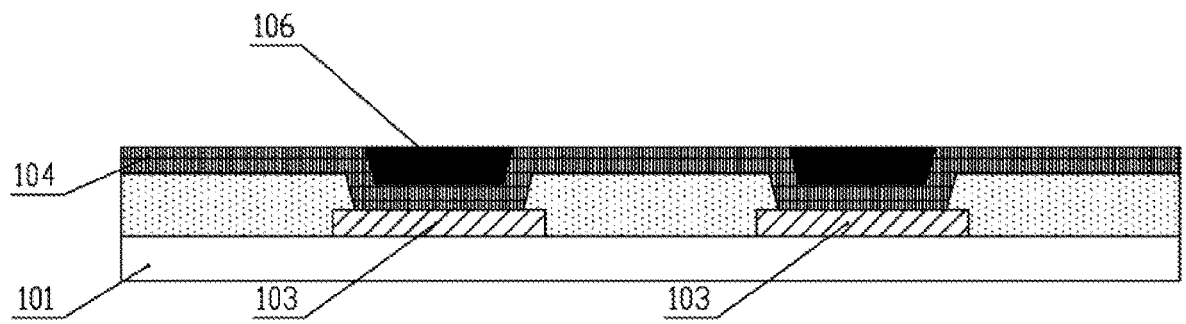

As illustrated in FIG. 1C, the first common layer 104 is formed over the pixel definition layer. The first common layer 104 completely covers the pixel definition layer and the anode layer.

The first common layer 104 may be formed by one layer of material, or may also be formed by two or more layers of material. In the present embodiment, the first common layer 104 includes a hole injection layer and a hole transport layer. The hole injection layer and the hole transport layer are stacked in order in a direction away from the anodes. The hole injection layer and the hole transport layer have similar functions and may be collectively referred to as a hole transport functional layer.

The light-emitting layer 106 is formed over the first common layer 104. The light-emitting layer 106 includes at least two light-emitting units corresponding to the sub-pixel openings.

The light-emitting layer 106 is an organic semiconductor, has a special energy band structure, and after absorbing electrons moved from the anodes, emits photons of certain wavelengths. Photons entering our eyes are colors we see.

Figure 1D:
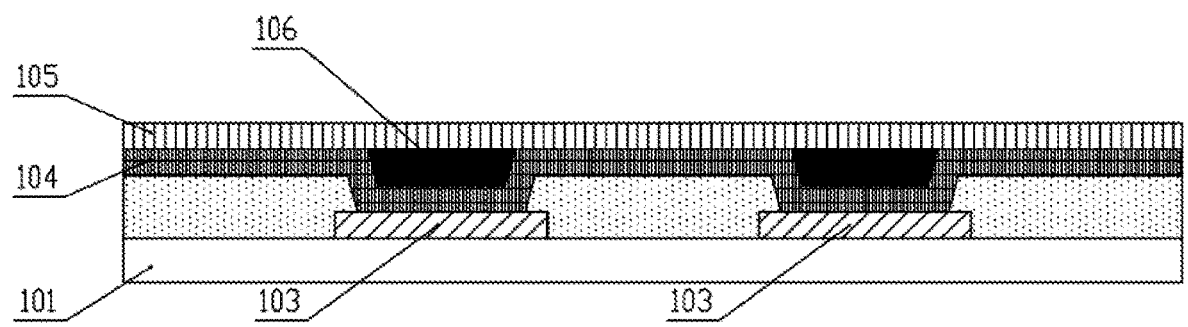

As illustrated in FIG. 1D, the second common layer 105 is deposited over the first common layer 104. The second common layer 105 completely covers the light-emitting layer 106 and the first common layer 104.

The second common layer 105 may be formed by one layer of material, or may also be formed by two or more layers of material. In the present embodiment, the second common layer 105 includes an electron injection layer and an electron transport layer. The electron injection layer and the electron transport layer are stacked in order in a direction away from the cathodes. The electron injection layer and the electron transport layer have similar functions and may be collectively referred to as an electron transport functional layer.

Figure 1E:
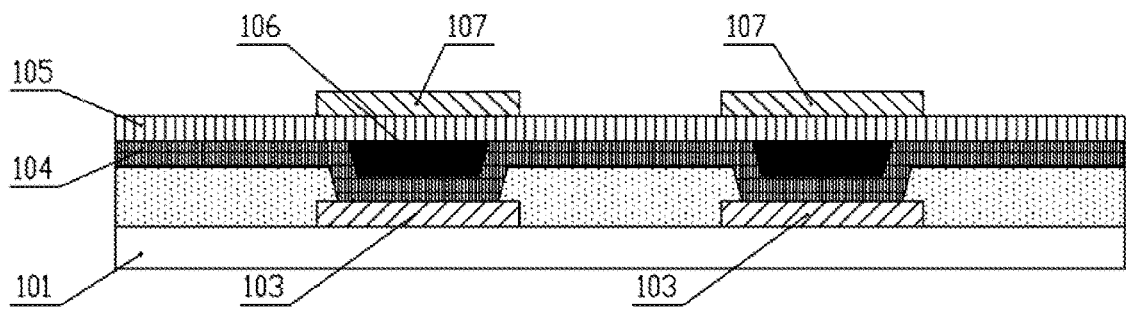

As illustrated in FIG. 1E, the cathode layer is deposited over the second common layer 105. The cathode layer is usually a low work function alloy and generates electrons at a given voltage. Then, a photoresist layer is coated over the cathode layer, and the cathode layer is processed using a patterning process including exposure using a mask layer, development, etching, and lift-off, to form at least two sub-cathodes 107 separated from each other in the cathode layer. Preferably, the sub-cathodes 107 also serve as touch electrodes. Then, a same mask process is used to form touch signal lines 102 in the cathode layer.

Figure 2:
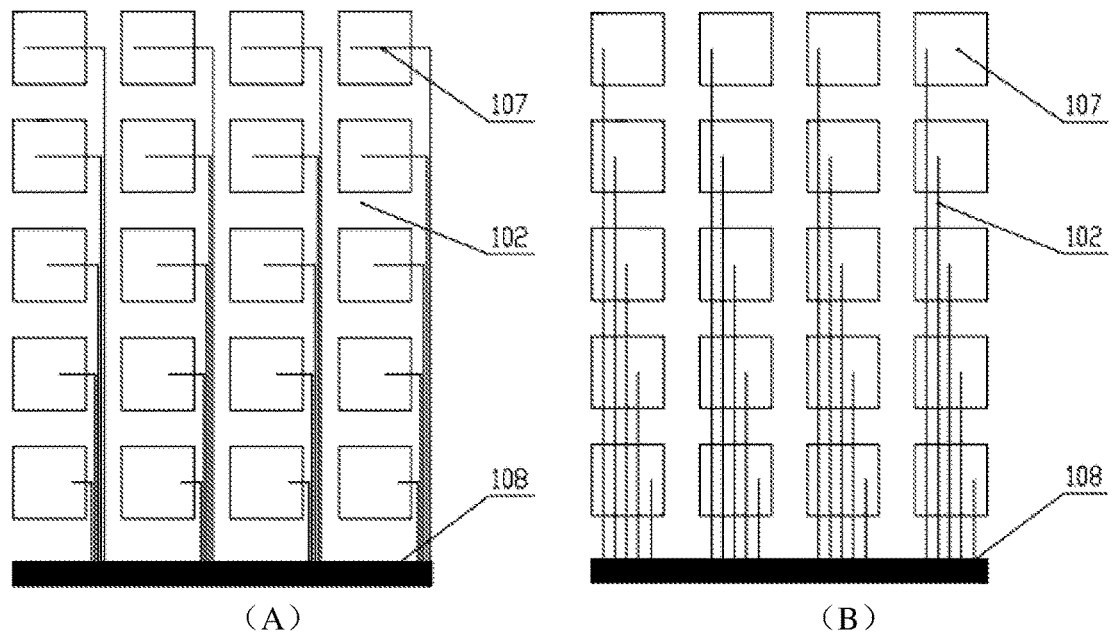
FIG. 2 is a top-view diagram of sub-cathodes and touch signal lines of an OLED touch display panel in accordance with a first preferred embodiment of the present disclosure.

As illustrated FIG. 2, the sub-cathodes 107 are in one-to-one correspondence with the touch signal lines 102, and each of the sub-cathodes 107 is electrically connected to a touch display chip 108 through the touch signal line 102. In the present preferred embodiment, the sub-cathodes 107 have one of a triangular shape, a quadrangular shape, and a circular shape.

Moreover, the touch signal lines 102 and the sub-cathodes 107 are etched from a same metal layer or different metal layers. As illustrated in FIG. 2A, the touch signal lines 102 and the sub-cathodes 107 are etched from the same metal layer. As illustrated in FIG. 2B, the touch signal lines 102 and the sub-cathodes 107 are etched from the different metal layers.

The array circuit layer is configured to, in a display period of a period of a frame of picture of the OLED touch display panel, drive the OLED touch display panel to display an image, and configured to, in a touch control period of the period of the frame of picture of the OLED touch display panel, drive the OLED touch display panel to generate a touch signal corresponding to a touch operation of a user.

In the display period of the period of the frame of picture, a common voltage signal may be transmitted to the touch electrodes through the corresponding touch signal lines 102. In the touch control period of the period of the frame of picture, touch scan signals may be transmitted to the touch electrodes through the corresponding touch signal lines 102. A touch circuit may detect whether self-capacitance of the touch electrodes has a variation through the corresponding touch signal lines 102.

Figure 3:
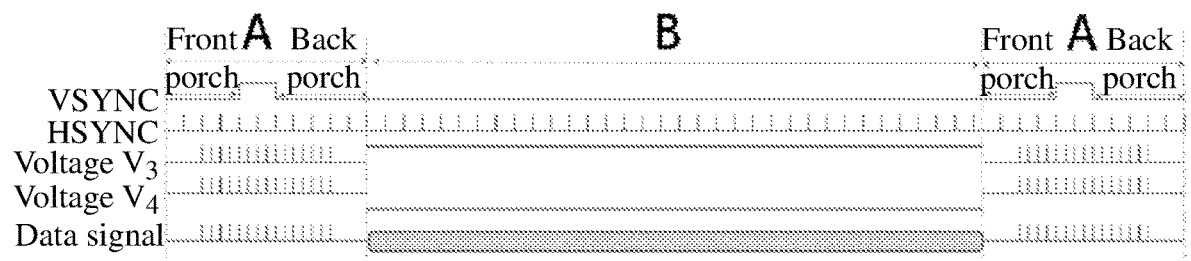
FIG. 3 is a circuit timing diagram of an OLED touch display panel in accordance with a first preferred embodiment of the present disclosure.
Figure 4:
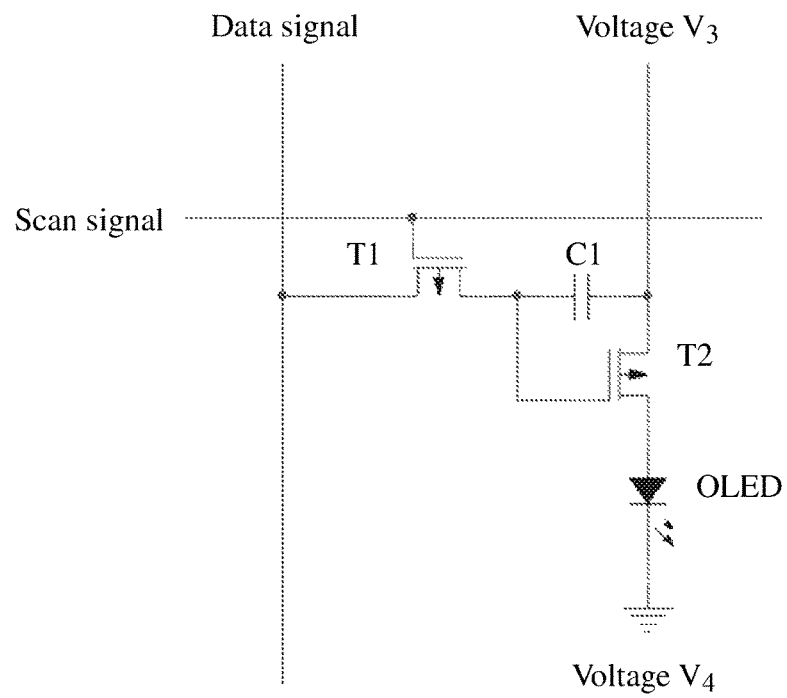
FIG. 4 is a pixel circuit diagram of an OLED touch display panel in accordance with a first preferred embodiment of the present disclosure.

FIG. 3 is a circuit timing diagram of an OLED touch display panel in accordance with a first preferred embodiment of the present disclosure. The circuit timing diagram includes a display stage and a touch control stage. The touch control stage is denoted using "A", and the display stage is denoted using "B". FIG. 4 is a pixel circuit diagram of an OLED touch display panel in accordance with a first preferred embodiment of the present disclosure. In the present embodiment, preferably, T1 is a P-type thin film transistor, T2 is an N-type thin film transistor, a voltage V3 is a voltage ELVDD, i.e., an OLED anode voltage, and a voltage V4 is a voltage ELVSS, i.e., an OLED cathode voltage.

During the display period, in a pixel circuit of the OLED touch display panel, a low-level voltage at the first input terminal turns on the thin film transistor T1, and a high-level voltage at the second input terminal turns on the thin film transistor T2. The voltage ELVDD is connected to an anode in the OLED circuit, and therefore is transmitted to the anode in the OLED circuit. The sub-cathodes 107 separated from each other are connected to the voltage ELVSS.

As can be known from the circuit timing diagram, the voltage ELVSS is lower than the voltage ELVDD. The OLED circuit forward conducts. Being driven by a certain voltage, electrons and holes are respectively injected to the electron transport layer and the hole transport layer respectively from a cathode and the anode. The electrons and the holes are moved to the light-emitting layer 106 respectively through the electron transport layer and the hole transport layer, and meet each other in the light-emitting layer 106. When the electrons enter the holes, excess energy may be released in the form of light, causing the OLED touch display panel to normally emit light.

During the touch control period, in the pixel circuit of the OLED touch display panel, a high-level voltage at the first input terminal turns off the thin film transistor T1. The thin film transistor 12 may use a first capacitor C to maintain a constant voltage difference between a gate electrode (i.e., the second input terminal) and a source electrode of the thin film transistor T. Therefore, a voltage at the anode of the OLED circuit is same as the voltage ELVDD.

As can be known from FIG. 4, at this time, a waveform of the voltage ELVDD is same as a waveform of the cathode voltage ELVSS. Hence, a voltage difference across the OLED circuit is zero. Without being driven by a voltage, electrons and holes cannot enter the light-emitting layer 106 to cause the OLED touch display panel to emit light.

In addition, the touch electrodes in the divided cathode layer may work independently, outputting sinusoidal or square waves to charge capacitors. By examining capacitance between the touch electrodes and a ground, whether the OLED touch display panel is touched is calculated.

Second Embodiment

Figure 5:
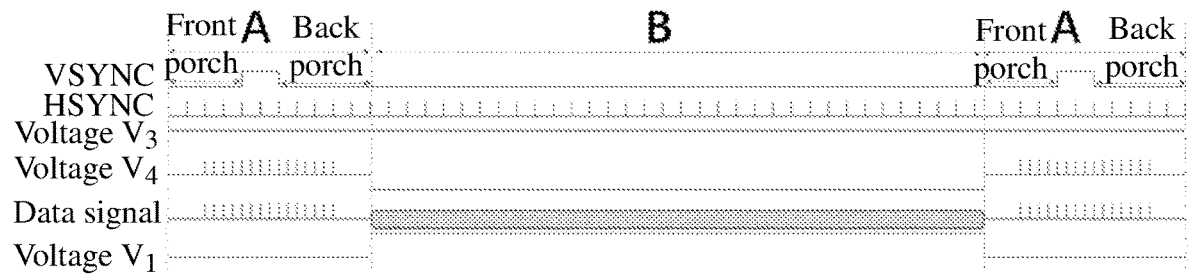
FIG. 5 is a circuit timing diagram of an OLED touch display panel in accordance with a second preferred embodiment of the present disclosure.
Figure 6:
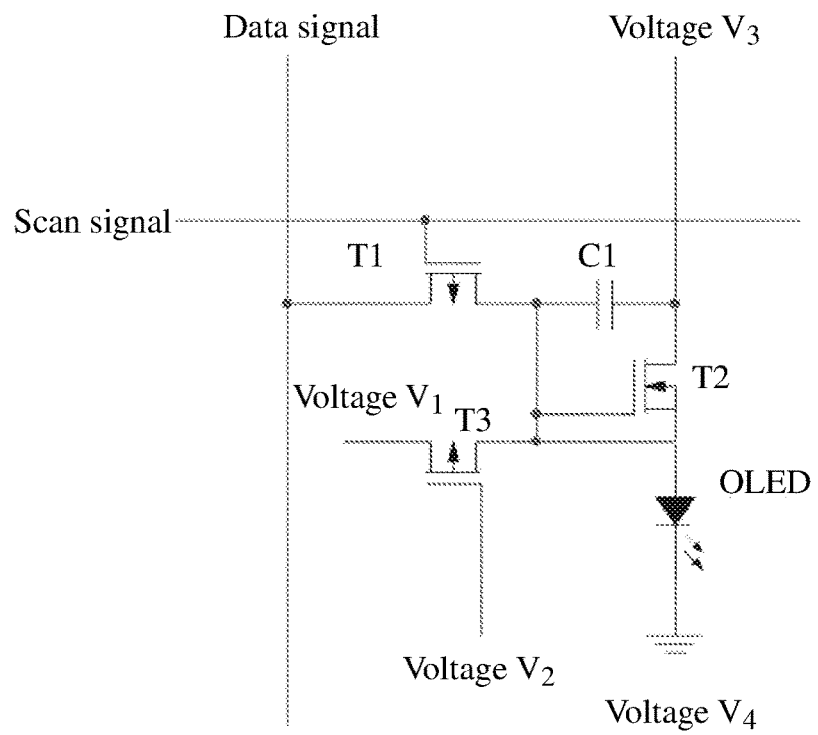
FIG. 6 is a pixel circuit diagram of an OLED touch display panel in accordance with a second preferred embodiment of the present disclosure.

FIG. 5 is a circuit timing diagram of an OLED touch display panel in accordance with a second preferred embodiment of the present disclosure. The circuit timing diagram includes a display stage and a touch control stage. The touch control stage is denoted using "A", and the display stage is denoted using "B". FIG. 6 is a pixel circuit diagram of an OLED touch display panel in accordance with a second preferred embodiment of the present disclosure. In the present embodiment, preferably, T1 is a P-type thin film transistor, T2 is an N-type thin film transistor, T3 is a P-type thin film transistor, a voltage V2 is an enable signal voltage, a voltage V3 is a voltage ELVDD, i.e., an OLED anode voltage, and a voltage V4 is a voltage ELVSS, i.e., an OLED cathode voltage.

During the display period, similar to the first embodiment, in a pixel circuit of the OLED touch display panel, a low-level voltage at the first input terminal turns on the thin film transistor T1, a high-level voltage at the second input terminal turns on the thin film transistor T2, and a high-level voltage at an enable signal terminal turns off the thin film transistor T3. The voltage ELVDD is connected to an anode in the OLED circuit, and therefore is transmitted to the anode in the OLED circuit. The sub-cathodes 107 separated from each other are connected to the voltage ELVSS. As can be known from the circuit timing diagram, the voltage ELVSS is lower than the voltage ELVDD. The OLED circuit forward conducts, and the OLED touch display panel normally emits light.

During the touch control period, in the pixel circuit of the OLED touch display panel, a high-level voltage at the first input terminal turns off the thin film transistor T1, and a low-level voltage at the enable signal terminal turns on the thin film transistor T3.

Because of a short circuit, the voltage ELVDD cannot be transmitted to the anode of the OLED circuit. A voltage V1 is connected to the anode of the OLED circuit, and is transmitted to the anode of the OLED circuit. The voltage V1 is lower than the voltage ELVSS. The OLED circuit is in a reverse-biased state. No voltage drives electrons and holes to enter the light-emitting layer 106 to cause the OLED touch display panel to emit light.

Therefore, the present disclosure, by dividing the cathode layer into the two sub-cathodes 107 separated from each other and also serving as touch electrodes, by connecting the touch electrodes to the touch chip through the touch signal lines 102, and by time-division driving the OLED touch display panel using the array circuit layer, accurate positioning of touched positions may be realized, and meanwhile, thickness of a module may be decreased.

Figure 7:
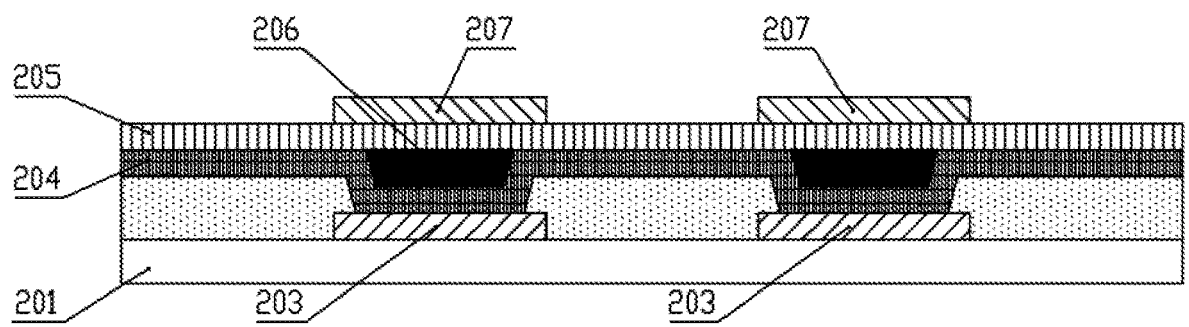
FIG. 7 is a film layer structural diagram of an OLED touch display panel in accordance with a preferred embodiment of the present disclosure.

The present disclosure also provides an OLED touch display panel. FIG. 7 is a film layer structural diagram of an OLED touch display panel in accordance with a preferred embodiment of the present disclosure. The touch display panel includes a base substrate 201, an anode layer, a functional layer, a cathode layer, and touch signal lines 202.

In the present embodiment, an array circuit layer is deposited over a glass substrate, to form a base substrate 101. The glass substrate is a monocrystalline silicon substrate or a polycrystalline silicon substrate.

The anode layer is formed over the base substrate 201, and the anode layer includes at least two anodes 203 arranged in an array, such as a first anode and a second anode illustrated in FIG. 7. The anode layer is mainly used to provide holes absorbing electrons, and because of being transparent, allows emitted light to pass therethrough.

The functional layer includes a first common layer 204, a light-emitting layer 206, and a second common layer 205.

The first common layer is formed over the base substrate 201, and the first common layer completely covers the anode layer.

The first common layer 204 may be formed by one layer of material, or may also be formed by two or more layers of material. In the present embodiment, the first common layer 204 includes a hole injection layer and a hole transport layer. The hole injection layer and the hole transport layer are stacked in order in a direction away from the anodes 203. The hole injection layer and the hole transport layer have similar functions and may be collectively referred to as a hole transport functional layer.

The light-emitting layer 206 is formed over the first common layer 204, and the light-emitting layer 206 includes at least two light-emitting units, such as a first light-emitting unit and a second light-emitting unit in FIG. 7.

The light-emitting layer 206 is an organic semiconductor, has a special energy band structure, and after absorbing electrons moved from the anodes, emits photons of certain wavelengths. Photons entering our eyes are colors we see.

The second common layer 205 is formed over the first common layer 204, and the second common layer 205 completely covers the light-emitting layer 206 and the first common layer 204.

The second common layer 205 may be formed by one layer of material, or may also be formed by two or more layers of material. In the present embodiment, the second common layer 205 includes an electron injection layer and an electron transport layer. The electron injection layer and the electron transport layer are stacked in order in a direction away from the cathodes. The electron injection layer and the electron transport layer have similar functions and may be collectively referred to as an electron transport functional layer.

The cathode layer is formed over the second common layer 205. The cathode layer is usually a low work function alloy and generates electrons at a given voltage.

The cathode layer includes at least two sub-cathodes 207 separated from each other. The sub-cathodes 207 also serve as touch electrodes.

Figure 8:
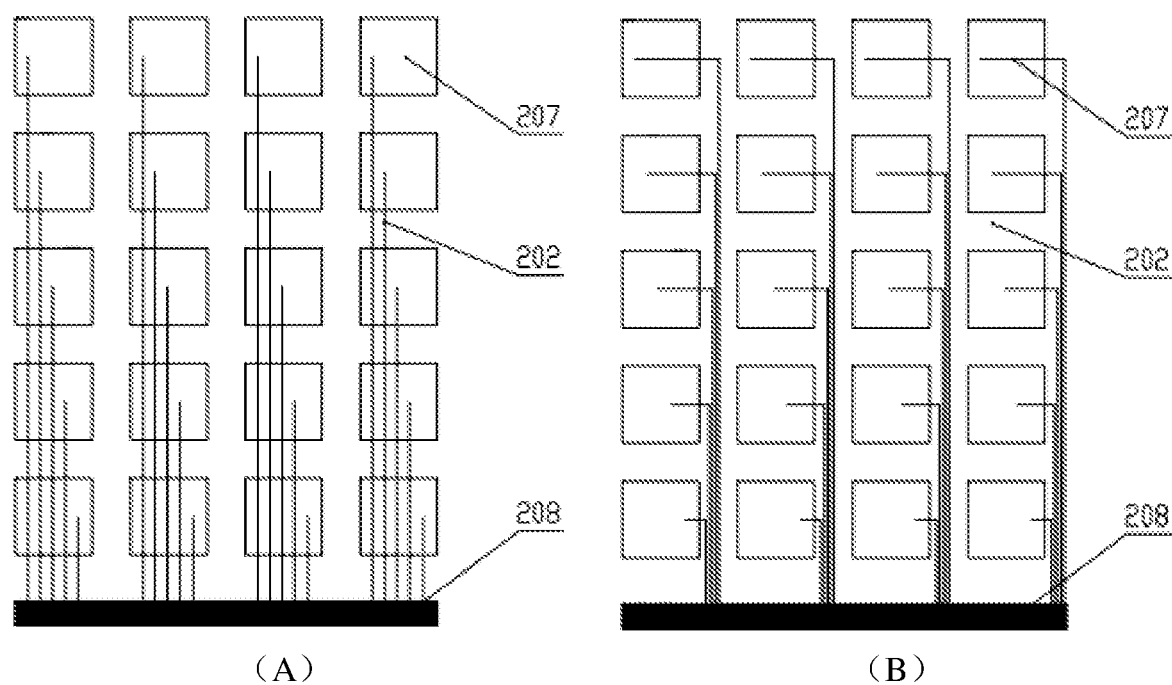
FIG. 8 is a film layer structural top-view diagram of an OLED touch display panel in accordance with a preferred embodiment of the present disclosure.

As illustrated FIG. 8, the sub-cathodes 207 are in one-to-one correspondence with the touch signal lines 202, and each of the sub-cathodes 207 is electrically connected to a touch display chip 208 through the touch signal line 202. In the present preferred embodiment, the sub-cathodes 207 have one of a triangular shape, a quadrangular shape, and a circular shape.

Moreover, the touch signal lines 102 and the sub-cathodes 107 are etched from a same metal layer or different metal layers. As illustrated in FIG. 8A, the touch signal lines 102 and the sub-cathodes 107 are etched from the same metal layer. As illustrated in FIG. 8B, the touch signal lines 102 and the sub-cathodes 107 are etched from the different metal layers.

The array circuit layer is configured to, in a display period of a period of a frame of picture of the OLED touch display panel, drive the OLED touch display panel to display an image, and configured to, in a touch control period of the period of the frame of picture of the OLED touch display panel, drive the OLED touch display panel to generate a touch signal corresponding to a touch operation of a user.

In the display period of the period of the frame of picture, a common voltage signal may be transmitted to the touch electrodes through the corresponding touch signal lines 202. In the touch control period of the period of the frame of picture, touch scan signals may be transmitted to the touch electrodes through the corresponding touch signal lines 202.

A touch circuit may detect whether self-capacitance of the touch electrodes has a variation through the corresponding touch signal lines 202.

During the display period, an OLED circuit in the pixel circuit forward conducts, and the OLED touch display panel normally emits light, under a common operation of a first input terminal fed with a low-level voltage and a second input terminal fed with a high-level voltage in a pixel circuit of the OLED touch display panel. During the touch control period, a voltage difference across the OLED circuit is zero, and the OLED touch display panel does not emit light, under a common operation of the first input terminal fed with a high-level voltage, the second input terminal fed with a first voltage, and a capacitor maintaining the first voltage in the pixel circuit of the OLED touch display panel, wherein the second input terminal is connected with the capacitor.

Alternatively, during the display period, an OLED circuit in the pixel circuit forward conducts, and the OLED touch display panel normally emits light, under a common operation of a first input terminal fed with a low-level voltage, a second input terminal fed with a high-level voltage, and an enable signal terminal fed with a high-level voltage in a pixel circuit of the OLED touch display panel. During the touch control period, the OLED circuit in the pixel circuit is reverse-biased, and the OLED touch display panel does not emit light in response to a high-level voltage applied to the first input terminal and a low-level voltage applied to the enable signal terminal in the pixel circuit of the OLED touch display panel.

Specific embodiments of the present disclosure are similar to the first embodiment and the second embodiment, and are not described one by one here.

The present disclosure provides an OLED touch display panel and a driving method. The OLED touch display panel includes an array circuit layer, an anode layer, a cathode layer, and touch signal lines. The cathode layer is divided into the two sub-cathodes separated from each other and also serving as touch electrodes. The sub-cathodes are in one-to-one correspondence with the touch signal lines, and each of the sub-cathodes is electrically connected to a touch display chip through the touch signal line. In a pixel circuit of the OLED touch display panel, under common operations of a first input terminal and a second input terminal fed with different voltages, the OLED touch display panel normally emits light or does not emit light. Moreover, the array circuit layer time-division drives the OLED touch display panel, so as to realize accurate positioning of touched positions. Meanwhile, because there is no need to externally mount a touch screen on the OLED display apparatus, thickness of a module may be decreased.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A driving method for driving a pixel circuit of an organic light-emitting diode (OLED) touch display panel, wherein the pixel circuit comprises:
   a first thin film transistor having a gate electrode receiving a scan signal, a first source or drain electrode receiving a data signal, and a second source or drain electrode electrically connected to a first node;

a second thin film transistor having a gate electrode electrically connected to the first node, a first source or drain electrode receiving a first supply voltage signal, and a second source or drain signal electrically connected to an anode of an OLED circuit;

a capacitor having one end electrically connected to the first node and another end electrically connected to the first source or drain electrode of the second thin film transistor; and the OLED circuit having a cathode receiving a second supply voltage signal, wherein the cathode is also used as a plurality of touch electrodes; and wherein the driving method comprises:

during a display period, controlling the first thin film transistor to be turned on by the scan signal, and controlling the second thin film transistor to be turned on by the data signal, to forward conduct the OLED circuit to cause the OLED touch display panel to normally emit light; and during a touch control period, controlling the first thin film transistor to be turned off by the scan signal, causing the second thin film transistor to be turned on by the capacitor, and causing a waveform of the first supply voltage signal to be same as a waveform of the second supply voltage signal, to cause a voltage difference across the OLED circuit to be zero to cause the OLED touch display panel not to emit light, and causing a waveform of the data signal to be same as the waveform of the second supply voltage signal.

2. The driving method of claim 1, wherein the OLED touch display panel comprises:
an array circuit layer;
a functional layer;
an anode layer;
a cathode layer formed over the functional layer and comprising at least two sub-cathodes separated from each other, wherein the sub-cathodes correspondingly serve as the touch electrodes; and
touch signal lines;
wherein the sub-cathodes are in one-to-one correspondence with the touch signal lines, and each of the sub-cathodes is electrically connected to a touch display chip through the touch signal line.

3. The driving method of claim 2, wherein the array circuit layer is configured to, in the display period of a period of a frame of picture of the OLED touch display panel, drive the OLED touch display panel to display an image, and configured to, in the touch control period in the time during which of the period of the frame of picture of the OLED touch display panel, drive the OLED touch display panel to generate a touch signal corresponding to a touch operation of a user.

4. An OLED touch display panel, comprising:
a pixel circuit, comprising:
a first thin film transistor having a gate electrode receiving a scan signal, a first source or drain electrode receiving a data signal, and a second source or drain electrode electrically connected to a first node;
a second thin film transistor having a gate electrode electrically connected to the first node, a first source or drain electrode receiving a first supply voltage signal, and a second source or drain signal electrically connected to an anode of an OLED circuit;

a capacitor having one end electrically connected to the first node and another end electrically connected to the first source or drain electrode of the second thin film transistor; and the OLED circuit having a cathode receiving a second supply voltage signal, wherein the cathode is also used as a plurality of touch electrodes;

wherein during a display period, the first thin film transistor is controlled to be turned on by the scan signal, the second thin film transistor is controlled to be turned on by the data signal, to forward conduct the OLED circuit to cause the OLED touch display panel to normally emit light; and wherein during a touch control period, the first thin film transistor is controlled to be turned off by the scan signal, the second thin film transistor is caused to be turned on by the capacitor, and a waveform of the first supply voltage signal is caused to be same as a waveform of the second supply voltage signal, to cause a voltage difference across the OLED circuit to be zero to cause OLED touch display panel not to emit light, and a waveform of the data signal is caused to be same as the waveform of the second supply voltage signal.

5. The display panel of claim 4, further comprising:
a base substrate having an array circuit layer formed therewith;
an anode layer;
a functional layer;
a cathode layer formed over the functional layer and comprising at least two sub-cathodes separated from each other, wherein the sub-cathodes correspondingly serve as the touch electrodes; and
touch signal lines;
wherein the sub-cathodes are in one-to-one correspondence with the touch signal lines, and each of the sub-cathodes is electrically connected to a touch display chip through the touch signal line.

6. The display panel of claim 5, wherein the array circuit layer is configured to, in the display period of a period of a frame of picture of the OLED touch display panel, drive the OLED touch display panel to display an image, and configured to, in the touch control period of the period of the frame of picture of the OLED touch display panel, drive the OLED touch display panel to generate a touch signal corresponding to a touch operation of a user.

7. The display panel of claim 5, wherein the functional layer comprises:
a first common layer formed over the base substrate, and completely covering the anode layer;
a light-emitting layer formed over the first common layer, and comprising at least two light-emitting units; and
a second common layer formed over the first common layer, and completely covering the light-emitting layer and the first common layer.

8. A driving method for driving a pixel circuit of an OLED touch display panel,
wherein the pixel circuit comprises:
a first thin film transistor having a gate electrode receiving a scan signal, a first source or drain electrode receiving a data signal, and a second source or drain electrode electrically connected to a first node;
a second thin film transistor having a gate electrode electrically connected to the first node, a first source or drain electrode receiving a first supply voltage signal, and a second source or drain signal electrically connected to the first node;

a third thin film transistor having a gate electrode receiving an enable signal, a first source or drain electrode receiving a first voltage signal, and a second source or drain signal electrically connected to the first node;

a capacitor having one end electrically connected to the first node and another end electrically connected to the first source or drain electrode of the second thin film transistor; and the OLED circuit having an anode electrically connected to the first node and a cathode receiving a second supply voltage signal, wherein the cathode is also used as a plurality of touch electrodes; and wherein the driving method comprises:

during a display period, controlling the first thin film transistor to be turned on by the scan signal, and controlling the second thin film transistor to be turned on by the data signal, and controlling the third thin film transistor to be turned off by the enable signal, to forward conduct the OLED circuit to cause the OLED touch display panel to normally emit light; and during a touch control period, controlling the first thin film transistor to be turned off by the scan signal, controlling the third thin film transistor to be turned on by the enable signal and causing a waveform of the first voltage signal and a waveform of the second supply voltage signal to cause the OLED circuit to be reverse-biased to cause the OLED touch display panel not to emit light.

9. The driving method of claim 8, wherein the OLED touch display panel comprises:

an array circuit layer;

a functional layer;

an anode layer;

a cathode layer formed over the functional layer and comprising at least two sub-cathodes separated from each other, wherein the sub-cathodes correspondingly serve as the touch electrodes; and touch signal lines;

wherein the sub-cathodes are in one-to-one correspondence with the touch signal lines, and each of the sub-cathodes is electrically connected to a touch display chip through the touch signal line.

10. The driving method of claim 9, wherein the array circuit layer is configured to, in the display period of a period of a frame of picture of the OLED touch display panel, drive the OLED touch display panel to display an image, and configured to, in the touch control period of the period of the frame of picture of the OLED touch display panel, drive the OLED touch display panel to generate a touch signal corresponding to a touch operation of a user.

* * * * *